United States Patent
Folberth et al.

(10) Patent No.: US 6,237,128 B1
(45) Date of Patent: *May 22, 2001

(54) METHOD AND APPARATUS FOR ENABLING PARALLEL LAYOUT CHECKING OF DESIGNING VLSI-CHIPS

(75) Inventors: Harald Folberth; Joachim Keinert, both of Böblingen; Jürgen Koehl, Weil i.Schönbuch; Kurt Pollmann, Altdorf; Oliver Rettig, Sindelfingen, all of (DE)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/944,797

(22) Filed: Oct. 6, 1997

(30) Foreign Application Priority Data

Oct. 1, 1997 (EP) .............................................. 97 117 036

(51) Int. Cl.[7] .................................................. G06F 17/50
(52) U.S. Cl. ........................................ 716/7; 716/1; 716/5
(58) Field of Search ......................... 395/500.08, 500.09, 395/500.1, 500.11, 500.12; 716/7, 8, 10, 11, 5, 1

(56) References Cited

U.S. PATENT DOCUMENTS

| | | | |
|---|---|---|---|
| 5,046,012 | * | 9/1991 | Morishita et al. .................... 700/121 |
| 5,218,551 | * | 6/1993 | Agrawal et al. ......................... 716/10 |
| 5,475,583 | * | 12/1995 | Bock et al. .............................. 700/12 |
| 5,705,301 | * | 1/1998 | Garza et al. ............................... 430/5 |
| 5,774,371 | * | 6/1998 | Kawakami .............................. 716/10 |
| 5,883,814 | * | 3/1999 | Luk et al. ........................... 430/58.35 |

FOREIGN PATENT DOCUMENTS 3-105972 5/1991 (JP) .

* cited by examiner

*Primary Examiner*—Matthew Smith
*Assistant Examiner*—Vuthe Siek
(74) *Attorney, Agent, or Firm*—Floyd A. Gonzalez; Marc A. Ehrlich

(57) ABSTRACT

The present invention pertains to a design method for VLSI-chips. The chips are partitioned into segments in order to enable DRC and LVS. Thus, the memory requirements are kept below the limits of the platform used for the verification and the turnaround time is drastically reduced.

16 Claims, 1 Drawing Sheet

METHOD AND APPARATUS FOR ENABLING PARALLEL LAYOUT CHECKING OF DESIGNING VLSI-CHIPS

BACKGROUND OF THE INVENTION

This invention relates generally to the field of computer system design and test management. More particularly, it relates to a method for designing VLSI (Very Large Scale Integrated)-chips.

FIELD OF THE INVENTION

VLSI circuit design requires thousands of circuits and components to be physically placed and connected on a chip. This can be very costly, especially given that the actual process of designing, placing, and connecting the circuits on the chip can affect the performance and timing thereof. Therefore, it has become necessary to automate the design process to quickly place and wire predesigned circuits into a functional chip.

BACKGROUND OF THE PRIOR ART

In VLSI physical design, there exist two different concepts, the Hierarchical Design and the Flat Design. The hierarchical approach is described in EP-B-0 271 596 to Pollmann et al. The circuit to be placed on-chip is logically partitioned into a number of functional subunits and each logical subunit is accommodated on a (rectangular) physical partition of chip area. Each of the logical partitions is manageable by the automatic design systems and programs presently known. Thus, the chip is composed of large logical components. These logical components are either built by standard physical design methods or custom designs. This design process is used when the physical design programs can not handle the full chip's netlist in placement and wiring or custom design can not be handled for the full chip, respectively. Each unit can be layout checked standalone and the full chip can be checked using black boxes as representers of these units. The disadvantages of this approach are that the components have to be built and verified rather a long time before the chip release. Furthermore, as the components are physical units for themselves, optimal placement and wiring of circuits contained in pathes crossing these units is not possible.

In U.S. Pat. No. 5,218,551, it is described how parts of the total chip design are assigned to precincts of the chip space. Next, basic elements are interchanged between said precincts in order to optimize chip overall timing and wirability.

In the flat design approach (see J. Koehl et al., "A Flat, Timing-Driven Design System for a High-Performance CMOS Processor Chipset", to appear in Proc. of DATE 1998) physical design methods enable the placement of any circuit on any place of the entire chip (except for some blockages) leading to optimal placement and wiring. Here, the chip space is not segmented at all. One advantage of this method is that the logical netlist can be changed relatively late prior to physical design. However, the chip, as a whole, can not be checked with respect to logic versus physical checking (LVS) and design rules check (DRC) restrictions of the checking equipment. In addition, the layout verification tools consume too much memory and CPU time resulting in a too high checking turn around time.

Currently, there are also three approaches in reducing the ressources needed for layout verification. Using hierarchical verification, the layout is checked bottom up. This requires the early design of the hierarchical units and the verification of the layout as well as of the representers needed.

In parallel checking, checking decks are split into several jobs each containing a group of checks on distinct related layers. While this reduces run time, it does not reduce peak memory requirements.

A solution of this problem would be the partitioning of the layout for checking only (physical partitioning, windowing). While this reduces peak memory, one must create an overhead to generate representers of the neigbour regions to avoid missing real errors or getting pseudo errors. However, this approach requires much manual intervention and is therefore time consuming. Also, this method only applies for DRC, not for LVS.

SUMMARY OF THE INVENTION

To reduce the storage requirements for and to enable DRC and LVS checking, future chips need to be partitioned. In this context, "enable" means to keep the main storage requirements below layout checking tools' limits and to shorten the checking cycle through parallelism.

Thus, it is an object of the present invention to provide a method for designing VLSI-chips that enables LVS and DRC checking to be used for chips carrying a huge number of circuits and components, while keeping the penalty for physical design to almost zero.

This and other objects are achieved by the present invention providing a method for designing VLSI chips comprising the steps of
a) partitioning the chip area into several segments,
b) providing physical decoupling of said segments by introducing divider macros at each boundary of said segments; and
c) placing circuitry on said segments, whereby the circuitry associated with each segment has a complexity that can be handled by available testing devices.

One decisive advantage of the present invention is the fact that future run time and data volume issues for DRC and LVS checking of large high density VLSI-chips can be resolved and kept below a certain limit by parallelising, i.e., checking the partitions parallel to each other, the verification as much as necessary, thereby retaining the flat design approach as well as the advantages of the hierarchical approach.

BRIEF DESCRIPTION OF THE DRAWINGS

The invention is now described in more detail in connection with the drawings, whereby.

DETAILED DESCRIPTION OF THE PREFERRED EMBODIMENT

Figure 1:
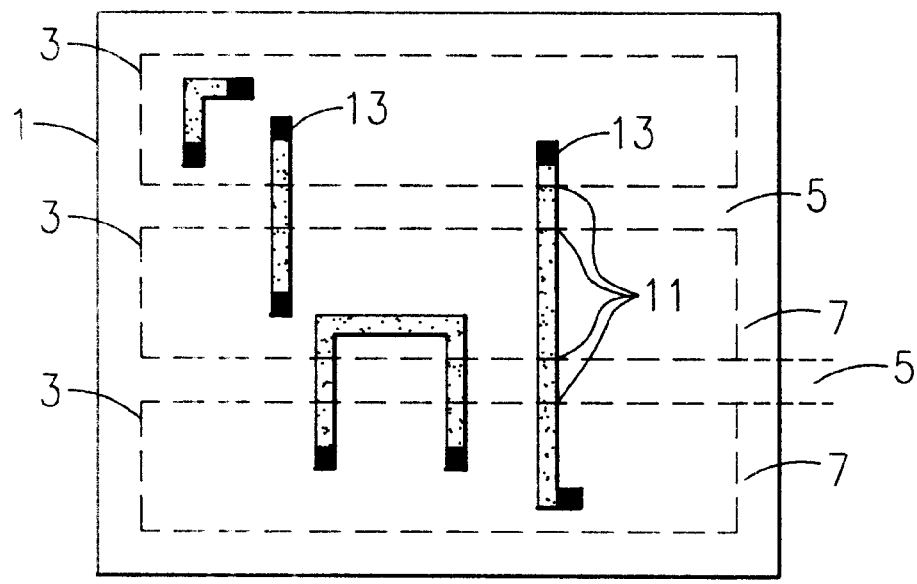
FIG. 1 shows a chip partitioned according to the invention.

According to FIG. 1, a chip 1 is first partitioned into arbitrary segments 3. To avoid pseudo errors and to guarantee that no real errors are missed, the partitioning is done such that the partitions are separated by gaps 5 wide enough to have no DRC ground rule interaction between partitions. This is guaranteed by divider macros which are used to separate the segments 3 from each other, thereby establishing such a distance that for front end design rules each segment can be checked standalone using common testing devices. There are no interacting design rules to other segments or the global area 7, which is the area around the segments including the gaps 5. Partitioning includes all design layers from frontend layers up to metal and via layers below last metal. On the other hand, last metal and final layers are global to all partitions, i.e., they are not assigned to a special segment but to the superior structure, and will therefore not be partitioned because most shapes on these layers belong to the global chip image and checking for these layers can easily be done for the whole chip, due to a small number of shapes of these layers. The top layer to be partioned must be a via layer because a via layer cannot be included in the global since the local metal below (as they belong to the segments) would be missing in the global.

In reality, the gaps 5 are comprised of different gaps for each divider depending on the design layer, e.g.

a gap for frontend layers, acting as a blockage (one circuit row high, or one column wide, respectively). This rule guarantees that each segment is DRC independent from other segments of the frontend layers due to separation of the segments;

a gap for wiring (e.g. two channels wide belonging to the global area). This guarantees for DRC correctness of the wiring layers because a minimum line width metal line has to extend at least two channels to be DRC correct. These minimum line lengths might occur on dividers that do not abut the current segment to be checked. The smaller gap for wiring is chosen to have only minimal impact on physical design from this blockage;

a gap for vias (e.g. two channels wide area blocked for vias). This rule guarantees for metal lines cut at the segment boundaries 11 (see below). These must be at least two channels long. A via on the first channel inside of the segment would lead to a one channel long metal line if it were cut at the segment boundaries 11. This rule can also enforce an adjacent via restriction across the segment boundaries if required by the used technology; and a gap to avoid pattern fill. Filler exclude shapes are part of the divider macro.

It has to be noted that the above described structure of the gaps is exemplary only and is not restrictive as the skilled worker will know.

Figure 2:
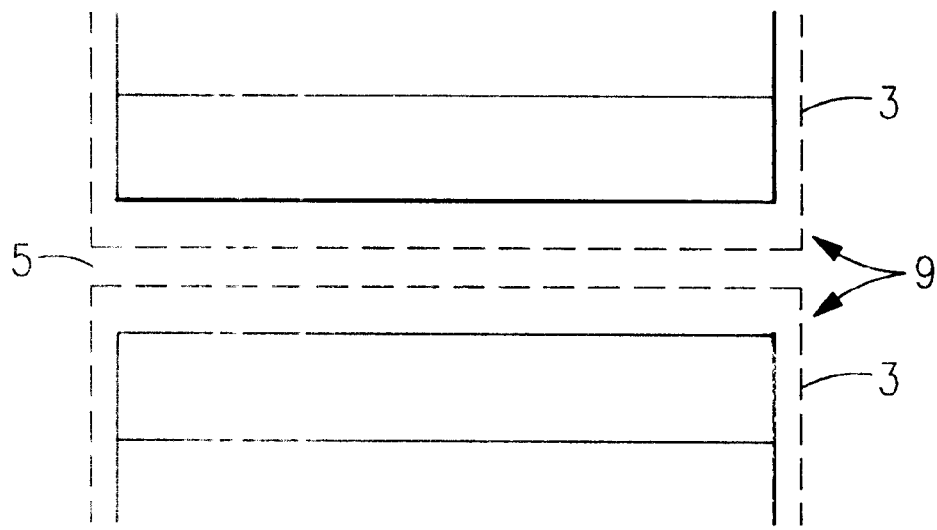
FIG. 2 schematically depicts a gap between two parts of the partitioned chip of FIG. 1.

An empty circuit row 9 (FIG. 2) is used to partition the design horizontally such that the distance between segments is large enough to avoid DRC pseudo errors, i.e., each segment is DRC correct for itself, partitioning does not create DRC violations. The height of the divider macro is preferably one circuit row.

For flexibility reasons a divider macro is a one-cell macro first forming a separator strip at the boundaries 11 of each segment, containing blockages, and thus defining areas where placement of circuits, macros, and filler cells is not allowed. It can be repeated arbitrarily, either horizontally and/or vertically along a circuit row or column to form a complete separator strip (as opposed to a structure formed by only one specially defined macro). These separator strips thus guarantee that no vias are present in the global area 7.

The segments 3 can be considered as the complement area of the dividing rows or columns, i.e., the difference between the chip area and the divider macros. The sum of the divider macros form the global area 7. It has to be mentioned that the extra space needed for the divider macros is negligible as compared to the whole chip area.

In an especially preferable embodiment of the invention, large macros, e.g., arrays or a big clock driver, are preplaced first such that the dividers have least impact on placement of medium and small sized macros.

After having placed the separator strips, the normal chip placement of macros and circuits over the whole chip area using the flat design approach described above takes place.

Since blockages have been placed in the separator strips circuits and macros are "assigned" to the segments so that circuits and macros only appear within the area of the segments. The separator strips are then filled with the divider macros.

Subsequently, normal chip routing takes place by a timing driven wiring of the circuits and macros.

For checking purposes, the wires are split and the ports are dropped at the segment boundaries 11 and backannotated to the logical netlist for LVS. Thus, there are only wires that are located either totally inside or totally outside of a segment (in the global area). The segments themselves are connected via global wiring interconnects 13, represented by short straight vertical lines. Since no vias are allowed outside of the segments, no via ground rules can be missed when checking is done on the partitions. Also, no frontend layers are present in the global area, these layers are only located inside the segments. As with the via rules, no check is missed when checking standalone. All this can be done at the symbolic layout level instead of the more complicated mask layout level.

After wiring has taken place, the mask data is generated ready for checking and release. It has to be noted that there is no separate mask data for checking.

With respect to DRC layout checking, each segment is checked together with the global shapes. The mask data is then checked using the standard checking control decks. When checking a particular segment, all other segments are omitted the checking program's omit directive. This leaves the segment to be checked together with the global area.

Methodology checks are necessary to check for invalid vias in the global area, the abutment of the connecting metal shapes of the gap to the ports of the segments as well as to verify that no global metal and via shapes are intruding a segment.

With respect to LVS each segment is checked standalone and a blackbox check concerning segment ports and global is performed.

What is claimed is:

1. A method for designing a VLSI-chip said VLSI-chip having a chip area, said method comprising the steps of:

a) partitioning the chip area into a plurality of segments for placing circuits, each one of said segments having distinct boundaries;

b) introducing divider macros at each of the boundaries of each one of said segments, said divider macros permitting no circuits therein so as to permit independent checking of each one of said segments; and c) placing circuitry on each one of said segments only, said placed circuitry in said segment having a limited complexity, said limitation based on limitations of available layout checking tools.

2. A method according to claim 1, comprising the additional step of preplacing large macros before performing step a).

3. A method according to claim 1, wherein the divider macros are arranged in an empty circuit row or in an empty circuit column.

4. A method according to claim 1, wherein the divider macros are used to form a gap between active, non-wiring layers of said segments.

5. A method according to claim 4, wherein a distance between the segments formed by said gap is large enough to avoid Design Rules Check pseudo errors.

6. A method according to claim 4 wherein said gap formed by said divider macros includes:

a frontend layer gap segment ensuring Design Rules Check independence between each of said segments;

a wiring gap segment ensuring Design Rules Check independence of said global wiring layer;

a via gap segment to ensure Design Rules Check independence for metal lines cut at the boundaries; and a pattern fill gap segment to avoid pattern fill, excluding shapes which are permitted within the divider macro;

wherein each of said gap segments is applied to a different design segment of said VLSI-chip and wherein each of said gap segments is capable of being of different dimensions.

7. A method according to claim 1, wherein the vias are not permitted within the divider macros.

8. A method according to claim 1, wherein the divider macros are arranged one of horizontally or vertically.

9. A method according to claim 1 further including the step of:

wiring without vias said circuitry placed within one of said segments to ensure that the circuits of said segment are electrically interconnected.

10. A method according to claim 1, wherein no frontend layers are present outside said segments.

11. A method according to claim 1, further including the steps of providing a global wiring layer for said VLSI-chip enabling an electrical connection between said segments, said global wiring layer including a last metal and final layers of said VLSI chip.

12. A VLSI-chip apparatus having a chip area, said VLSI-chip apparatus, formed by the method of:

a) partitioning the chip area into a plurality of segments for placing circuits, each one of said segments having distinct boundaries;

b) introducing divider macros at each of the boundaries of each one of said segments, said divider macros providing structural separation of each one of said segments so as to permit independent checking of said each one of said segments; and c) placing circuitry on each one of said segments only, said placed circuitry in said segment having a limited complexity, said limitation based on limitations of available layout checking tools.

13. An apparatus according to claim 12 wherein said method comprises the additional step of preplacing large macros before performing step a).

14. An apparatus according to claim 12, wherein the divider macros are arranged in an empty circuit row or in an empty circuit column.

15. An apparatus according to claim 12, wherein the divider macros are used to form a gap between active non-wiring layers of said segments.

16. An apparatus according to claim 15, wherein a distance between said segments formed by said gap is large enough to avoid Design Rules Check pseudo errors.

* * * * *